(12) United States Patent
Yamamoto et al.

(10) Patent No.: US 8,739,393 B2
(45) Date of Patent: Jun. 3, 2014

(54) ELECTRONIC COMPONENT MOUNTING METHOD

(75) Inventors: Shinji Yamamoto, Yamanashi (JP); Yasuyuki Ishitani, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/578,055

(22) PCT Filed: May 11, 2011

(86) PCT No.: PCT/JP2011/002618
§ 371 (c)(1),
(2), (4) Date: Aug. 9, 2012

(87) PCT Pub. No.: WO2012/056606
PCT Pub. Date: May 3, 2012

(65) Prior Publication Data
US 2012/0317802 A1    Dec. 20, 2012

(30) Foreign Application Priority Data

Oct. 27, 2010    (JP) .................................. 2010-240469

(51) Int. Cl.
*B23P 19/00*    (2006.01)

(52) U.S. Cl.
USPC .................. 29/740; 29/739; 29/741; 29/742; 29/721; 29/832

(58) Field of Classification Search
CPC ............. H05K 13/08; H05K 13/0413; H05K 13/0469; H05K 13/0452; H05K 3/1216; H05K 3/305
USPC ......... 29/740–743, 832–834, 592.2; 414/737, 414/752.1; 700/121–125; 250/559.29
See application file for complete search history.

(56) References Cited

U.S. PATENT DOCUMENTS 6,427,313 B2 *    8/2002    Ishitani et al. .................. 29/559
6,441,386 B2 *    8/2002    Sakaguchi ............... 250/559.29

(Continued)

FOREIGN PATENT DOCUMENTS

JP    09-181487 A    7/1997
JP    2004-71641    *    3/2004

(Continued)

OTHER PUBLICATIONS

International Search Report for PCT/JP2011/002618 dated Jun. 14, 2011.

*Primary Examiner* — Minh Trinh
(74) *Attorney, Agent, or Firm* — Pearne & Gordon LLP (57) ABSTRACT

It is an object to provide an electronic component mounting method that makes it possible to assure stable pickup operation even when a dimensional error attributable to a difference in production lot exists in electronic components or carrier tapes. During electronic component mounting adopting a tape splicing technique for splicing a carrier tape 15 already loaded on a tape feeder to a newly loaded carrier tape 15A, when an optical sensor 30 has detected a joint J between the already-loaded carrier tape 15 and the newly-loaded carrier tape 15A, a height measurement device 12 performs measurement of a component pickup height targeted for components P housed in the carrier tape 15A in connection with the tape feeder for which the joint J has been detected. Component pickup height data showing a target lowering height to which pickup nozzles 10a are to be lowered are updated on the basis of the measurement result.

2 Claims, 10 Drawing Sheets

(56) References Cited

U.S. PATENT DOCUMENTS

| | | | |
|---|---|---|---|
| 7,185,422 B2* | 3/2007 | Sakai et al. | 29/832 |
| 7,684,061 B2* | 3/2010 | Hiyoshi et al. | 356/634 |
| 7,849,588 B2* | 12/2010 | Onishi | 29/743 |
| 8,020,286 B2* | 9/2011 | Inoue et al. | 29/832 |
| 8,336,195 B2* | 12/2012 | Watanabe et al. | 29/740 |
| 2012/0317802 A1* | 12/2012 | Yamamoto et al. | 29/832 |

FOREIGN PATENT DOCUMENTS

| | | |
|---|---|---|
| JP | 2004-228442 A | 8/2004 |
| JP | 2005-005289 A | 1/2005 |
| JP | 2007-019297 A | 1/2007 |
| JP | 2007-059654 A | 3/2007 |
| JP | 2009-283949 A | 12/2009 |
| JP | 2010-186811 A | 8/2010 |
| JP | 2010-186940 A | 8/2010 |

* cited by examiner

ELECTRONIC COMPONENT MOUNTING METHOD

TECHNICAL FIELD

The present invention relates to an electronic component mounting apparatus and an electronic component mounting method for mounting electronic components on a substrate.

BACKGROUND ART

A tape feeder that pitch-feeds a carrier tape housing electronic components to a pickup position of a mount head provided on a component mounting mechanism has hitherto been heavily used as a configuration for feeding electronic components in an electronic component mounting apparatus. The carrier tape is fed while wound around and accommodated in a feed reel. When a component shortage has occurred in the tape feeder, there is performed reel replacement for replacing an already-loaded feed reel with a new feed reel. A splicing system recently tends to be adopted into reel replacement (see Patent Documents 1 and 2). The splicing system is intended for splicing a leading head of a carrier tape wound around a new feed reel to a tail end of the already-loaded carrier tape by splicing means, such as tape pasting means, when component shortage has occurred as a result of consumption of a carrier tape wound around one feed reel. The system yields an advantage of enabling replacement of a reel while the electronic component mounting apparatus maintains operation.

Since the splicing system splices two separate carrier tapes together, a difference occurs between an operating state in which an electronic component is picked up from an already-loaded carrier tape with a mount head and another operating state in which an electronic component is picked up from a newly-spliced carrier tape with the mount head. For this reason, the component mounting apparatus adopting the splicing system requires processing for making a correction on pickup conditions due to such a difference in operating state.

Under the related art described in connection with; for instance, Patent Document 1, every time a joint between the carrier tapes is detected, there are updated component pickup position data that are data used for making a positional correction when pickup nozzles of the mount head pick up the electronic components. This makes it possible to make corrections to positional displacement of electronic components within a horizontal plane of the electronic components attributable to splicing of the carrier tapes. Under the related art described in connection with Patent Document 2, when a joint is detected in a component feeding configuration that mixedly splices an embossed tape and a non-embossed tape together as a carrier tape, a determination is made as to whether a new carrier tape is an embossed tape or a non-embossed tape. A component pickup height for pickup nozzles is switched on the basis of a determination result. Thereby, a correction can be made to an error in component pickup height due to a difference in tape type.

RELATED ART DOCUMENT

Patent Document

Patent Document 1: JP-A-2007-59654
Patent Document 2: JP-A-2010-186811

DISCLOSURE OF THE INVENTION

Problem that the Invention is to Solve

In association with recent miniaturization and expansion of functionality of an electronic device, miniaturization of electronic components used in the electronic device has also proceeded. Moreover, an accuracy level required during mounting of electronic components becomes higher than that required in the related art. For this reason, the related-art techniques described in connection with the Patent Documents encounter difficulty in coping with the component mounting configuration requiring such a high accuracy level. The related art technique described in connection with Patent Document 1 can address horizontal positional displacement of electronic components due to splicing. However, when an error exists in depth of a component pocket of a carrier tape or height of electronic components for reasons of a difference in production lot, electronic components cannot be properly picked up and retained, so that normal pickup operation cannot be guaranteed. Under the related art technique described in connection with Patent Document 2, only switching between previously-specified component pickup heights is made on the basis of a result of determination of a tape type. When a carrier tape has a dimensional error due to a difference in production lot, it is difficult to perform stable, normal pickup operation in the same manner as mentioned above. As mentioned above, in the related art technique, when a dimensional error attributable to a difference in production lot exists in an electronic component or a carrier tape, the electronic component feeding configuration using the splicing system encounters a problem of difficulty in guaranteeing stable operation for picking up electronic components.

Accordingly, the present invention is intended for providing an electronic component mounting apparatus and an electronic component mounting method that enable assurance of stable pickup operation even when a dimensional error due to a difference in production lot exists in electronic components or a carrier tape.

Means for Solving the Problem

An electronic component mounting apparatus of the present invention corresponds to an electronic component mounting apparatus that picks up an electronic component from a carrier tape loaded on a tape feeder by a pickup nozzle and that transfers and populates the electronic component onto a substrate, the apparatus comprising a mount head equipped with a nozzle elevation mechanism for elevating and lowering the pickup nozzle; a storage unit that stores component pickup height data showing a position of a target height to which the pickup nozzle are to be lowered when the mount head picks up the electronic component; a tape feed mechanism that pitch-feeds the carrier tape housing the electronic component to a component pickup position for the pickup nozzle; a joint detection device that detects a joint between a carrier tape already loaded on the tape feeder and a newly loaded carrier tape and that outputs a detection signal; a component pickup height detection unit that measures a height of the component pickup position for electronic component housed in the newly-loaded carrier tape by a height measurement device according to a detection signal output from the joint detection unit, thereby determining a new component pickup height targeted for the electronic component housed in the carrier tape; and a data update processing unit that updates existing component pickup height data stored in the storage unit, by the new component pickup height.

An electronic component mounting method of the present invention corresponds to an electronic component mounting method for pitch-feeding, by a tape feed mechanism, a carrier tape that is loaded on a tape feeder and that houses an electronic component and lowering pickup nozzles at a component pickup position in accordance with component pickup height data stored in a storage unit, thereby picking up the electronic component by the pickup nozzle and transferring and populating the component onto a substrate, the method comprising a joint detection step of detecting a joint between an already-loaded carrier tape and a newly loaded carrier tape by a joint detection device and outputting a detection signal; a component pickup height measurement step of measuring, at the component pickup position, a component pickup height for electronic component housed in the newly loaded carrier tape by a component pickup height detection unit in accordance with the detection signal output in the joint detection step, thereby determining a new component pickup height; a component pickup height update step of updating the component pickup height data stored in the storage unit by the new component pickup height; and a component mounting step of lowering the pickup nozzles in accordance with the updated component pickup height data and picking up the electronic component from the newly loaded carrier tape and transferring and populating the electronic component onto a substrate.

Advantage of the Invention

According to the present invention, when a joint between an already loaded carrier tape and a new carrier tape to be loaded on a tape feeder is detected, component pickup height data pertaining to the tape feeder whose joint has been detected are updated. Defective component pickup operation caused by a dimensional error attributable to a difference in electronic components and carrier tape in terms of a vendor or production lot is prevented, so that pickup operation can be made stable.

BRIEF DESCRIPTION OF THE DRAWINGS

FIGS. 5(a) and (b) are descriptive views of tape splicing of the embodiment of the present invention.

FIGS. 6(a) and (b) are descriptive views of a unit that detects a joint between carrier tapes on the tape feeder of the embodiment of the present invention.

EMBODIMENT FOR IMPLEMENTING THE INVENTION

Figure 1:
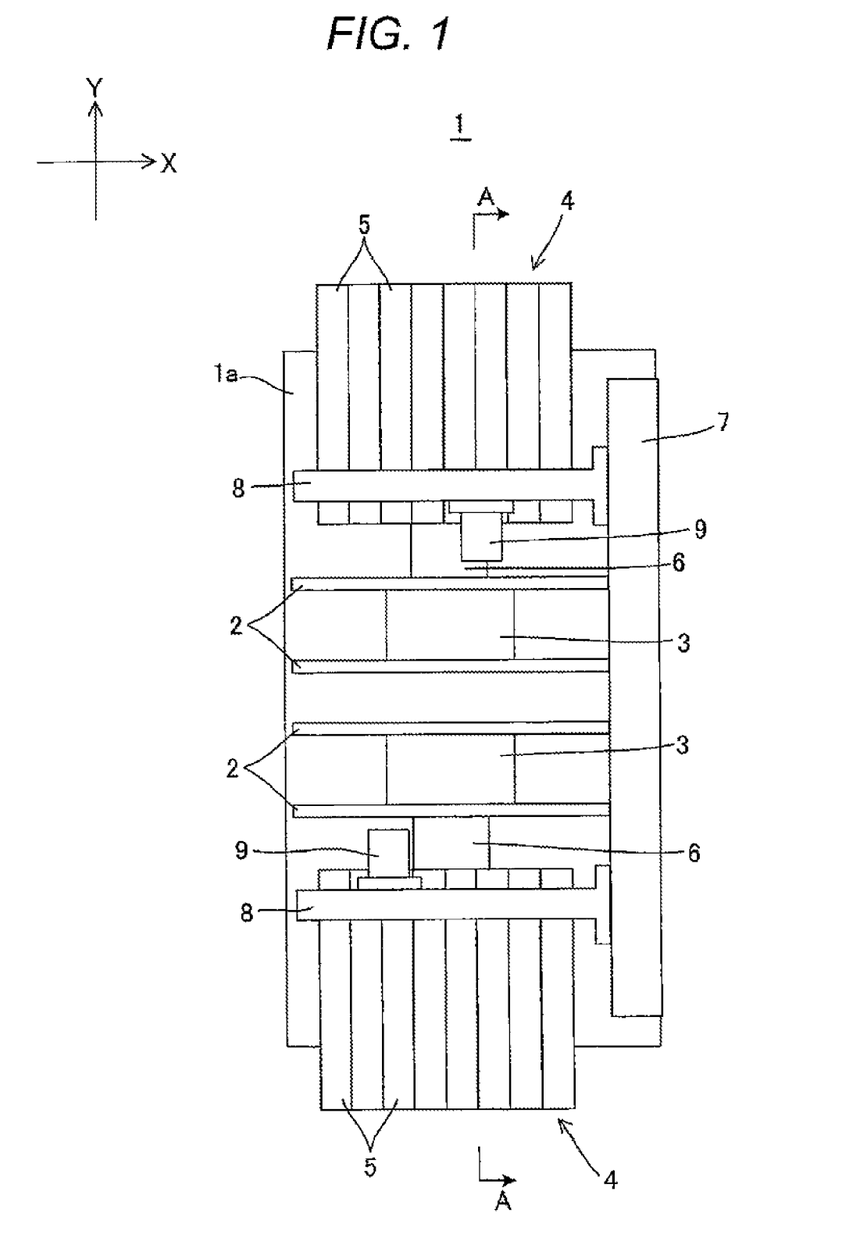
FIG. 1 is a plan view of an electronic component mounting apparatus of an embodiment of the present invention.

An embodiment of the present invention is now described by reference to the drawings. First, a structure of an electronic component mounting apparatus 1 is described by reference to FIG. 1, FIGS. 2(a) to (d), and FIG. 3. FIG. 3 partially shows a cross section taken along line A-A shown in FIG. 1. In FIG. 1, two rows of substrate conveyance mechanisms 2 are placed at a center of a bed 1 in a direction X (a direction of conveyance of a substrate). Each of the substrate conveyance mechanisms 2 conveys in the direction X a substrate 3 that is fed from an upstream apparatus and that is to become an object of component mounting operation performed by the electronic component mounting apparatus, positioning the substrate 3 at a component mounting work position. A component feed unit 4 is disposed on one side of each of the substrate conveyance mechanisms 2. A plurality of tape feeders 5 are disposed side by side in each of the component feed units 4. The tape feeder 5 has a function of pitch-feeding a carrier tape retaining components, thereby feeding components P to a component pickup position 5a (see FIG. 3) by means of pickup nozzles of a mount head to be described below.

A Y-axis transfer table 7 having a linear actuation mechanism is disposed along one side of an upper surface of the bed 1a in the direction X. Two X-axis transfer tables 8, each of which likewise has a linear actuation mechanism, are coupled to the Y-axis transfer table 7 so as to be movable in a direction Y. Each of the two X-axis transfer tables 8 is equipped with the mount head 9 so as to be transferrable in the direction X. The Y-axis transfer table 7 and the X-axis transfer tables 8 make up a head transfer mechanism (see FIG. 7). The mount heads 9 are transferred in both directions X and Y as a result of actuation of the head transfer mechanism. The Y-axis transfer table 7, the X-axis transfer tables 8, and the mount heads 9 make up a component mounting mechanism that transfers and populates the components P on the substrate 3 by means of transferring the mount heads 9 retaining the components P with the head transfer mechanism.

Figure 2:
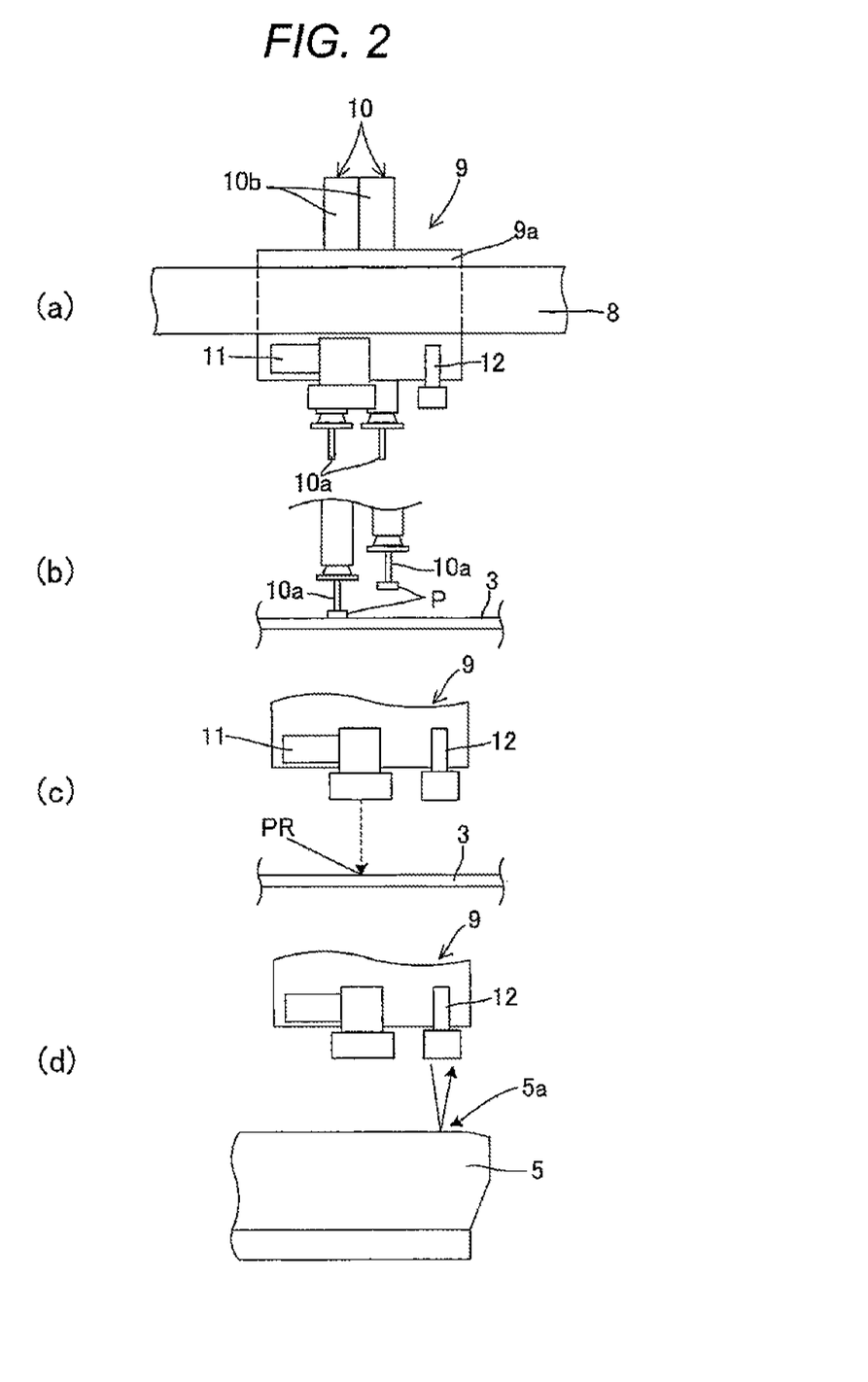
FIGS. 2(a) to (d) are descriptive views showing a configuration and function of a mount head unit installed in the electronic component mounting apparatus of the embodiment of the present invention.
Figure 3:
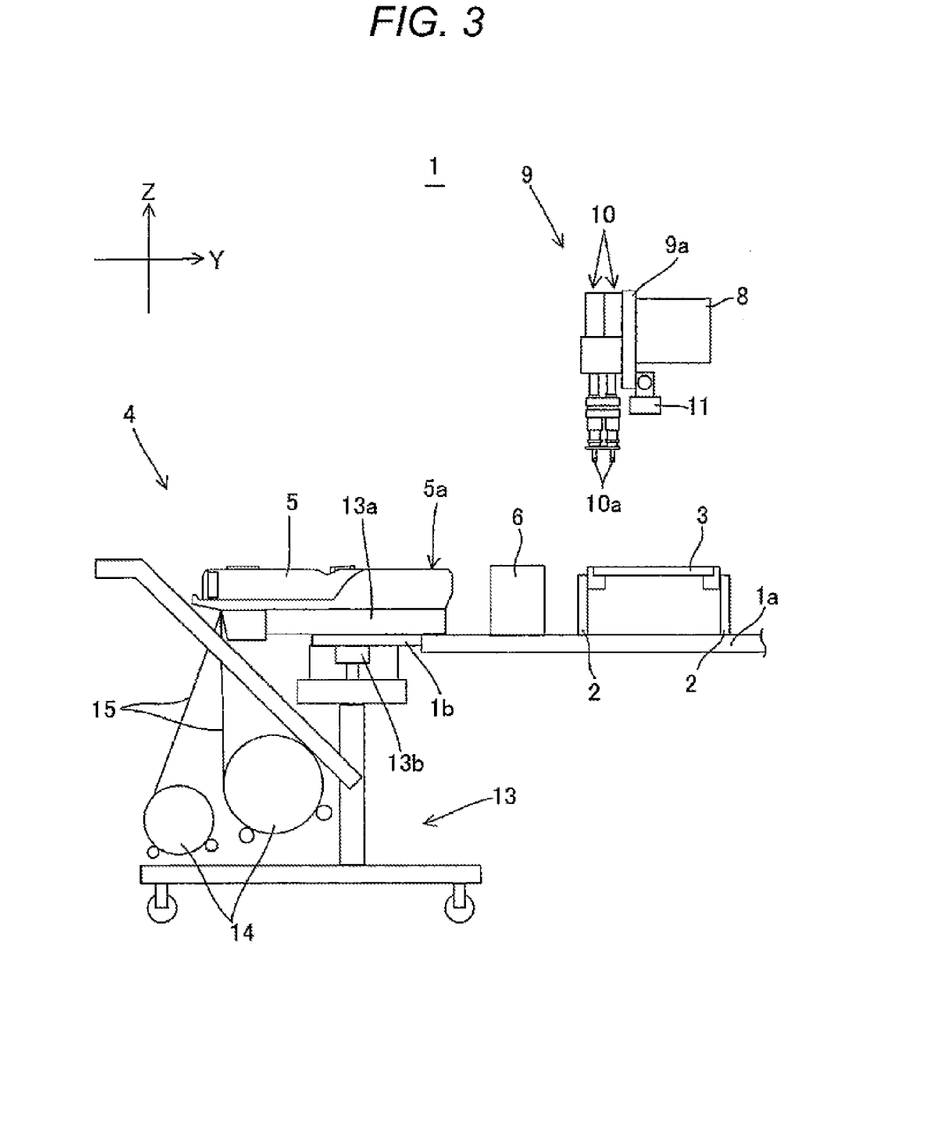
FIG. 3 is a fragmentary sectional view of the electronic component mounting apparatus of the embodiment of the present invention.

As shown in FIG. 2(a), each of the mount heads 9 is a multiple head built by attaching a plurality of unit transfer heads 10 to a transfer base 9a. Pickup nozzles 10a that pick up and retain components are attached to a lower end of each of the unit transfer heads 10. The pickup nozzles 10a are individually elevated or lowered by means of a nozzle elevation mechanism 10b provided on each of the unit transfer heads 10. The two mount heads 9 pick up the components P from the respective tape feeders 5 of the corresponding component feed units 4 by means of the pickup nozzles 10a. As shown in FIG. 2(b), the components are transferred and populated on the substrates 3 positioned at the respective component mounting work positions of the substrate conveyance mechanisms 2.

A substrate recognition camera 11 and a height measurement device 12 that move along with the mount head 9 in an integrated fashion are attached to the transfer base 9a so as to be positioned on a lower side of the X-axis transfer table 8. The substrate recognition camera 11 and the height measurement device 12 are transferred in conjunction with the mount head 9. The substrate recognition camera 11 is transferred to a point above the substrate 3, whereby the substrate recognition camera 11 captures an image of a recognition point PR set on the substrate 3 as shown in FIG. 2(c). The recognition processing unit 36 subjects an imaging result produced by the substrate recognition camera 11 recognition processing (see FIG. 7), thereby recognizing the component mounting point on the substrate 3. The height measurement device 12 is a measurement device, like a laser displacement gauge, that measures a height of a downwardly-positioned measurement object. The height measurement device 12 is transferred to the corresponding component feed unit 4 and positioned above the component pickup position 5a of the tape feeder 5. The height measurement device 12 thereupon measures a height of an upper surface of the components P pitch-fed to the component pickup position 5a; namely, a component pickup height of the pickup nozzles 10a (see FIG. 2(d)).

A component recognition camera 6 is interposed between the component feed unit 4 and the substrate conveyance mechanism 2. The component recognition camera 6 captures an image of the components P retained by the mount head 9 when the mount head 9 picked up the components from the component feed unit 4 is transferred above the component recognition camera 6. The recognition processing unit 36 (see FIG. 7) subjects an imaging result produced by the component recognition camera 6 to recognition processing, whereby the positions of the components P retained by the mount head 9 are detected. In operation during which the mount head 9 mounts the components P, the mount head 9 is positioned in consideration of the recognition result, whereby a correction is made to populating positions.

The configuration of the component feed unit 4 is described by reference to FIG. 3. A carriage 13 in which the plurality of tape feeders 5 are previously mounted on a feeder base 13a is set in the component feed unit 4. A clamp mechanism 13b clamps the feeder base 13a with respect to a stationary base 1b put on the base 1a, whereby a position of the carriage 13 is fixed in the component feed unit 4. Feed reels 14, each of which stores a carrier tape 15 retaining components in a rolled state, are held on the carriage 13. The tape feeder 5 pitch-feeds the carrier tape 15 withdrawn from the feed reels 14 to the component pickup position 5a for the pickup nozzles 10a.

Figure 4:
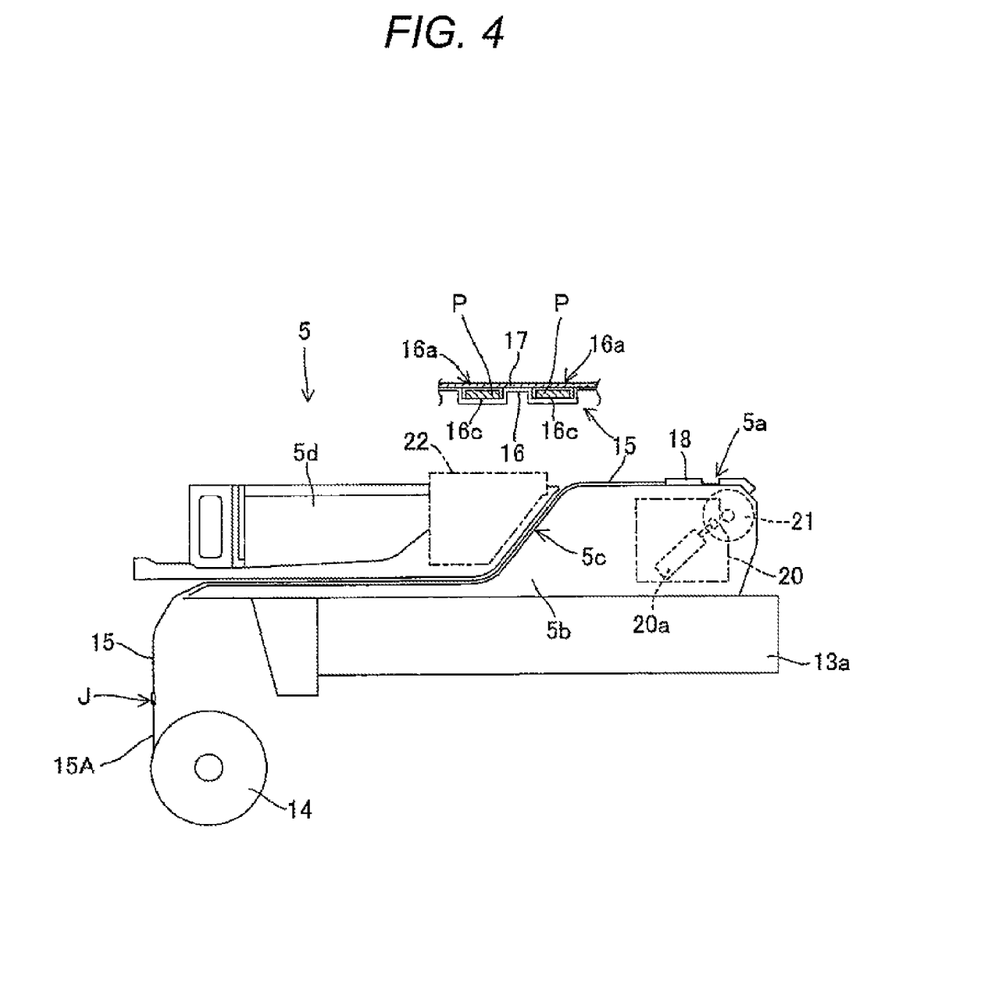
FIG. 4 is a descriptive view of a configuration of a tape feeder of the embodiment of the present invention.

A function of the tape feeder 5 is now described by reference to FIG. 4. As shown in FIG. 4, a tape running pathway 5c along which the carrier tape 15 runs is laid on a frame member 5b loaded on the feeder base 13a. The carrier tape 15 is formed from a base tape 16 and a top tape 17. Embossed portions 16c that create component pockets 16a corresponding to indentations for housing components are formed at constant pitches on the base tape 16. Further, the top tape 17 adheres to the base tape 16 so as to cover upper surfaces of the respective component pockets 16a. The components P are held in and prevented from falling off from the respective component pockets 16a by means of the top tape 17 stuck to the upper surfaces of the respective component pockets 16a.

The carrier tape 15 withdrawn from the feed reel 14 is introduced into the frame member 5b from its tail end and delivered to a downstream side over an upper surface of the tape running pathway 5c (on the right side of FIG. 4). When the carrier tape 15 wound around the feed reel 14 becomes consumed during component feed operation for feeding electronic components in a continuous manner by means of pitch-feeding the carrier tape 15, there is performed tape splicing for splicing a leading head of a new carrier tape 15A to be loaded to a tail end of the carrier tape 15 already loaded on the tape feeder 5 by way of a joint J.

A sprocket 21 actuated by a rotary drive mechanism 20 having a motor 20a is disposed in an upper portion of a downstream end of the frame member 5b. The sprocket 21 is equipped with feed pins 21a [see FIGS. 6(a), (b)] that engage with tape feed holes 16b [see FIGS. 5(a), (b)] opened in the carrier tape 15 at constant pitches. The sprocket 21 is intermittently rotated by means of the rotary drive mechanism 20, whereby the carrier tape 15 housing the components P is pitch-fed in a downstream direction.

Set in front of the sprocket 21 is the component pickup position 5a where the pickup nozzles 10a of each of the mount heads 9 pick up the components P in the respective component pockets 16a. The sprocket 21 and the rotary drive mechanism 20 work as a tape feed mechanism that pitch-feeds the carrier tape 15 housing the components P to the component pickup position 5a for the pickup nozzles 10a.

A guide 18 that guides the carrier tape 15 while covering a space over the carrier tape is placed on an upper surface of the downstream portion of the frame member 5b and in the vicinity of a component pickup position. The guide 18 is provided with a pickup opening 18a [see FIGS. 6(a), (b)] positioned in accordance with the component pickup position 5a. A downstream end of the pickup opening 18a works as a top tape peeler section for peeling the top tape 17. In the course of the carrier tape 15 running below the guide 18, the top tape peeler section peels the top tape 17, folding the thus-peeled top tape 17 back upstream. Each of the pickup nozzles 10a picks up the component P from the component pocket 16a uncovered as a result of exfoliation of the top tape. The thus-folded back top tape 17 is fed into and recovered by a tape recovery section 5d by means of a top tape feed mechanism 22.

Figure 5:
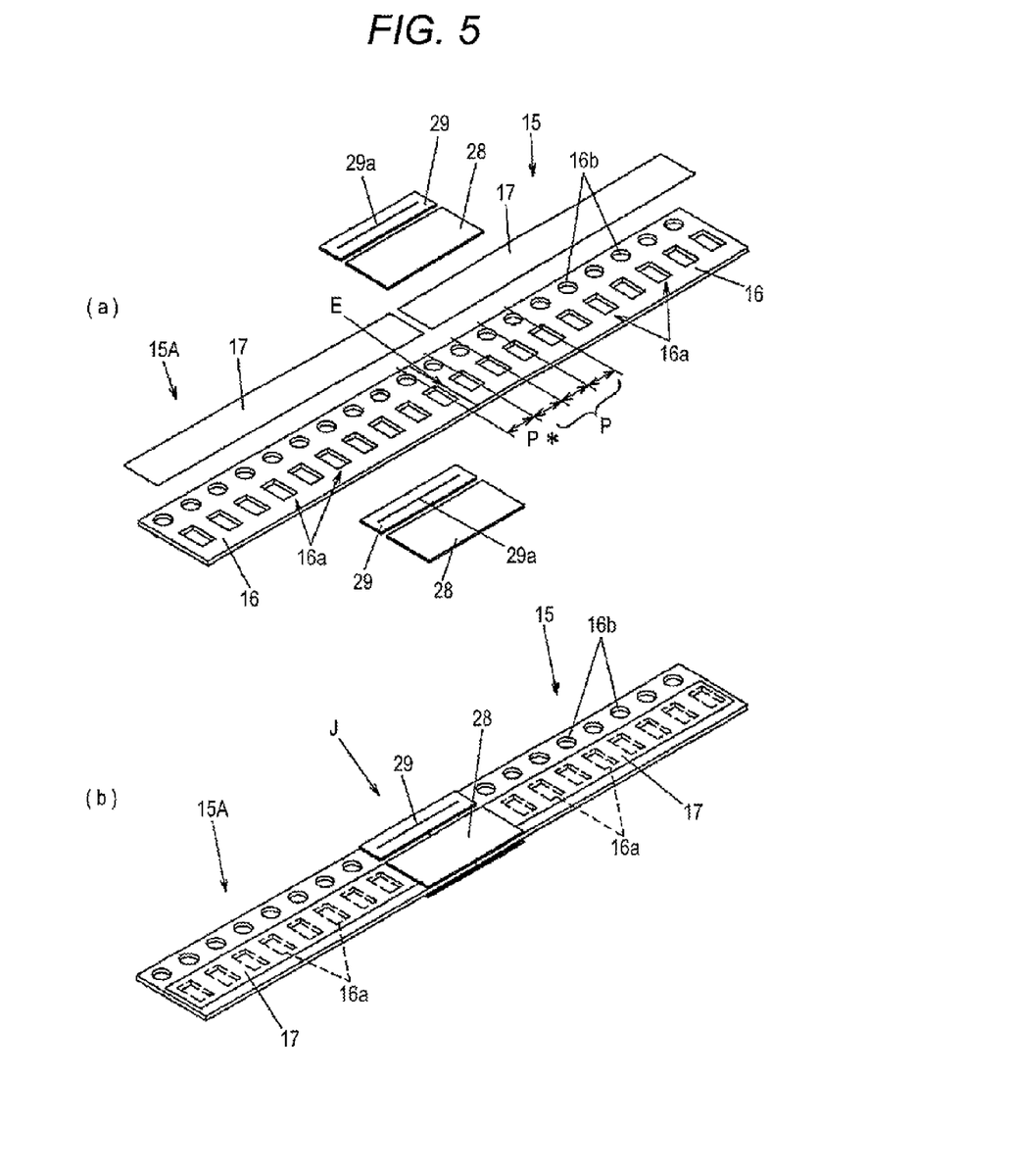

Tape splicing is now described by reference to FIGS. 5(a), (b). As shown in FIG. 5(a), the tail end of the carrier tape 15 already loaded on the tape feeder 5 is spliced to the leading head of the new carrier tape 15A to be loaded by way of a splice line E during tape splicing operation. Splice tapes 28 and 29 are pasted from above and blow to a position, where the tapes cover the component pocket 16a and the feed holes 16b, at a tape-pasting margin over the base tapes 16 with the splice line E sandwiched therebetween. As shown in FIG. 5(b), the two carrier tapes 15 and 15A make up a single continual carrier tape by means of the joint J.

A slit 29a is formed in each of the splice tapes 29 along its longitudinal direction. When the feed pins 21a of the sprocket 21 fit from below into the respective feed holes 16b, the feed pins 21a can upwardly protrude by way of the slit 29a, thereby preventing occurrence of a hindrance to tape-feeding operation. FIG. 5(a) shows a state in which the top tape 17 is peeled off from the base tape 16. During tape splicing, the splice tapes 28 are pasted to the top tape 17 from above.

Tape splicing operation is performed by use of a custom-designed jig. The two carrier tapes 15 and 15A are positioned in such a way that a pitch p* between two component pockets 16a with the splice line E sandwiched therebetween becomes equal to a predetermined pitch "p" on the base tape 16.

A joint detection device for detecting the joint J in the course of the carrier tape 15 being fed is now described by reference to FIGS. 6(a), (b). FIG. 6(a) shows a plan view of the guide 18 placed at a leading end portion of the frame member 5b. The component pocket 16a becomes exposed within the pickup opening 18a formed in the guide 18 in accordance with the pickup position for the pickup nozzle 10a. The feed pins 21a of the sprocket 21 engage with the feed holes 16b at a downstream position with respect to the pickup opening 18a. A groove 18c for letting the feed pins 21a escape is formed in a position on the guide 18 corresponding to the sprocket 21. The groove 18c prevents the feed pins 21a, which protrude toward the upper surface side by way of the feed holes 16b, from interfering with the guide 18.

Figure 6:
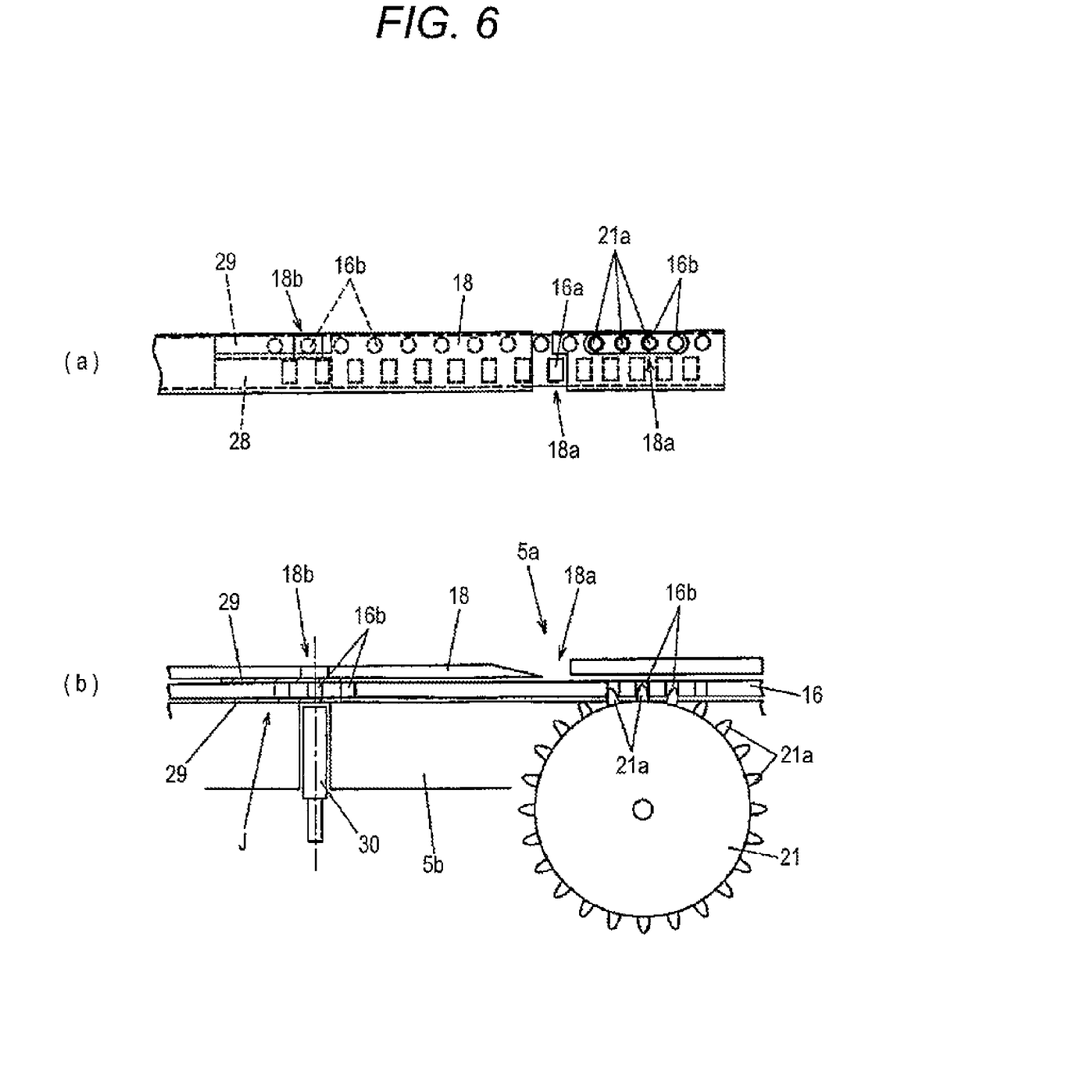
Figure 7:
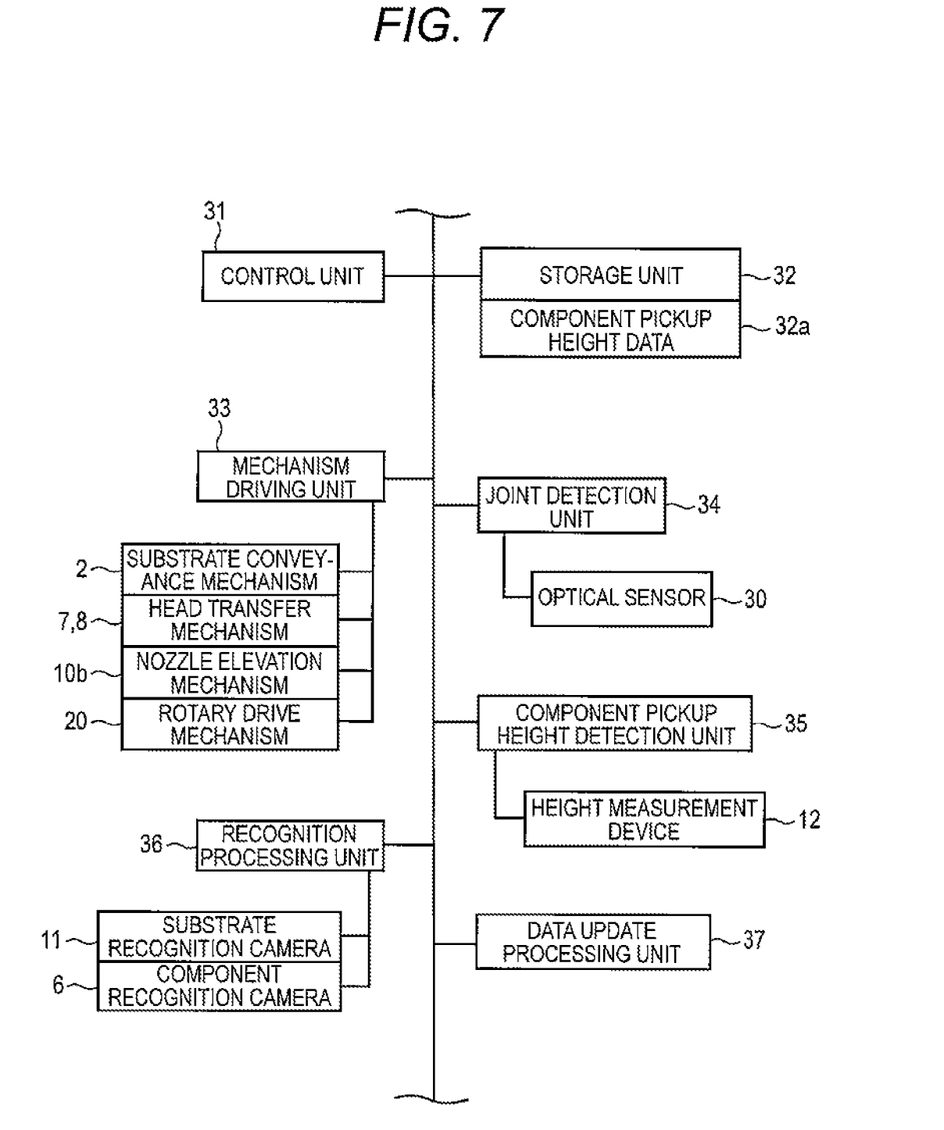
FIG. 7 is a unit diagram showing a configuration of a control system of the electronic component mounting apparatus of the embodiment of the present invention.

Opening 18b for detecting a joint is formed at a position on the guide 18 corresponding to a point above each of the feed holes 16*b* while spaced apart from the pickup opening 18*a* on the upstream side. As shown in FIG. 6(*b*), a reflection-type optical sensor 30 is inserted from below into the frame member 5*b* at a position corresponding to the opening 18*b*. A detection signal output from the optical sensor 30 is sent to a joint detection unit 34 (FIG. 7). The joint detection unit 34 detects the joint J in the carrier tape 15 according to the detection signal from the optical sensor 30.

Specifically, when a normal portion of the carrier tape 15 passes by the point above the optical sensor 30, light originating from the optical sensor 30 upwardly transmits through the feed hole 16*b* and the opening 18*b* at timing when the feed hole 16*b* comes to a position between a sensor 25 and the opening 18*b*. The optical sensor 30 does not detect reflected light at this timing, thereby sending a signal showing that the feed hole 16*b* is detected. The feed hole detection signal is repeatedly output at intervals equivalent to the feed hole pitches, whereby the joint detection unit 34 determines that there is no joint.

On the contrary, as shown in FIG. 6(*b*), when the joint J at which the feed holes 16*b* are closed by the splice tapes 29 passes by the point above the optical sensor 30, the light originating from the optical sensor 30 is reflected by the splice tape 29 within a range where the splice tapes 29 are pasted to the carrier tape 15, so that the feed holes 16*b* are not detected. By means of a state in which the feed holes are not detected remaining continuous for a predetermine period, the joint detection unit 34 detects that the joint J passes by the position of the optical sensor 30.

By reference to FIG. 7, a configuration of a control system is now described. In FIG. 7, a control unit 31 is a CPU and controls operation and processing of the entire apparatus. In addition to storing various programs and data for letting the electronic component mounting apparatus 1 perform component mounting operation, a storage unit 32 stores component pickup height data 32*a*. The component pickup height data 32*a* are data that show a target height position to which the pickup nozzles 10*a* are lowered during operation for picking up the components P by means of the mount head 9. A mechanism driving unit 33 is under control of the control unit 31 and actuates the substrate conveyance mechanism 2, the head transfer mechanism made up of the Y-axis transfer table 7 and the X-axis transfer table 8, the nozzle elevation mechanism 10*b*, and the rotary drive mechanism 20. In accordance with the detection signal from the optical sensor 30, the joint detection unit 34 detects the joint J between the carrier tape 15 already loaded on the tape feeder 5 and the new carrier tape 15A to be loaded, thereupon outputting a detection signal. The optical sensor 30 and the joint detection unit 34 are embodied as the joint detection device that outputs a detection signal upon detection of the joint J having reached a predetermined upstream position with respect to the component pickup position 5*a*.

A component pickup height detection unit 35 performs processing to be described below. Namely, the height measurement device 12 that is a height measurement device measures a height of the component pickup position 5*a* for the components P housed in the newly-loaded carrier tape 15A, in accordance with the detection signal output from the joint detection device, thereby determining a new component pickup height targeted for the components P housed in the carrier tape 15A. The recognition processing unit 36 subjects imaging results produced by the substrate recognition camera 11 and the component recognition camera 6 to recognition processing, thereby recognizing and detecting positions of the component mount points on the substrate 3 and positions of the components P retained by the mount head 9. A data update processing unit 37 performs processing for updating the existing component pickup height data 32*a* stored in the storage unit 32, by use of a new component pickup height.

Figure 8:
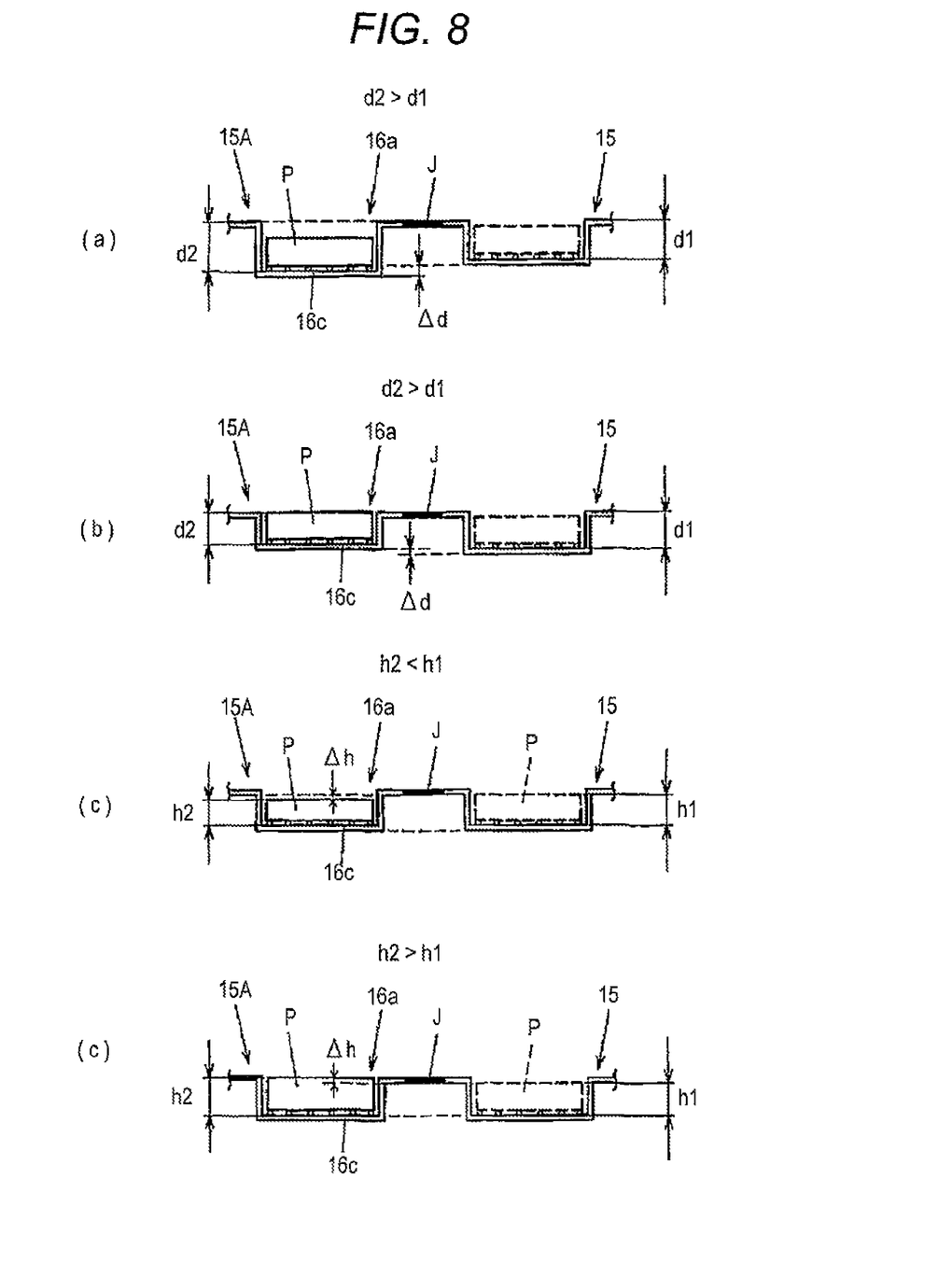
FIGS. 8(a) to (d) are descriptive views of a dimensional error in a joint between the carrier tapes used in the electronic component mounting apparatus of the embodiment of the present invention.

By reference to FIGS. 8(*a*) to (*d*), a change in the component pickup height of the joint J existing between the already-loaded carrier tape 15 and the newly-loaded carrier tape 15A is now described. According to a component type commanded by design information, components P are prepared at a production site where component mounting operation is performed. The feed reel 14 around which the carrier tape 15 housing the components P is wounded is loaded in the component feed unit 4. In relation to feeding of components, even in the case of components of the same type or components produced by the same manufacturer, a component size or detailed dimensions of each of the component pockets 16*a* of the carrier tape 15 may change because of a difference among manufacturers or production lots. Even in such a case, the already-loaded carrier tape 15 and the carrier tape 15A to be newly loaded are spliced together, on occasion of feeding of components, as components of the same type at the production site where the tape splicing technique is adopted.

For instance, FIG. 8(*a*) shows an example in which a depth d2 of the component pocket 16*a* of the carrier tape 15A is larger than a depth d1 of the component pocket 16*a* of the carrier tape 15 by an amount of Δd. Conversely, FIG. 8(*b*) shows an example in which the depth d2 of the component pocket 16*a* of the carrier tape 15A is smaller than the depth d1 of the component pocket 16*a* of the carrier tape 15 by the amount of Δd. In such a case, a target lowering height of the pickup nozzles 10*a* that pick up and retain the components P changes before and after the joint J passes by the component pickup position 5*a*.

FIG. 8(*c*) shows a case where the component pockets 16*a* of the carrier tape 15 and the component pockets 16*a* of the carrier tape 15A assume the same depth; however, where a difference exists in heights of the components P housed in the respective pockets and in which a height h1 of the components P housed in the component pockets 16*a* of the carrier tape 15 is larger than a height h2 of the components P housed in the component pockets 16*a* of the carrier tape 15A by an amount of Δh. Conversely, FIG. 8(*d*) shows a case where the height h1 of the components P housed in the component pockets 16*a* of the carrier tape 15 is smaller than the height h2 of the components P housed in the component pockets 16*a* of the carrier tape 15A by an amount of Δh.

Likewise, even in such a case, the target lowering height for the pickup nozzles 10*a* that pick up and retain the components P varies before and after the joint J passes by the component pickup position 5*a*. In such a case, if component pickup is performed without updating the component pickup height data 32*a*, operation failures, such as erroneous pickup of the components P performed by the pickup nozzles 10*a*, may also arise. In order to prevent occurrence of such faulty operation, the component pickup height data 32*a* are updated to a normal appropriate value in the embodiment by use of the joint detection device and a function of detecting a component pickup height as described below.

Figure 9:
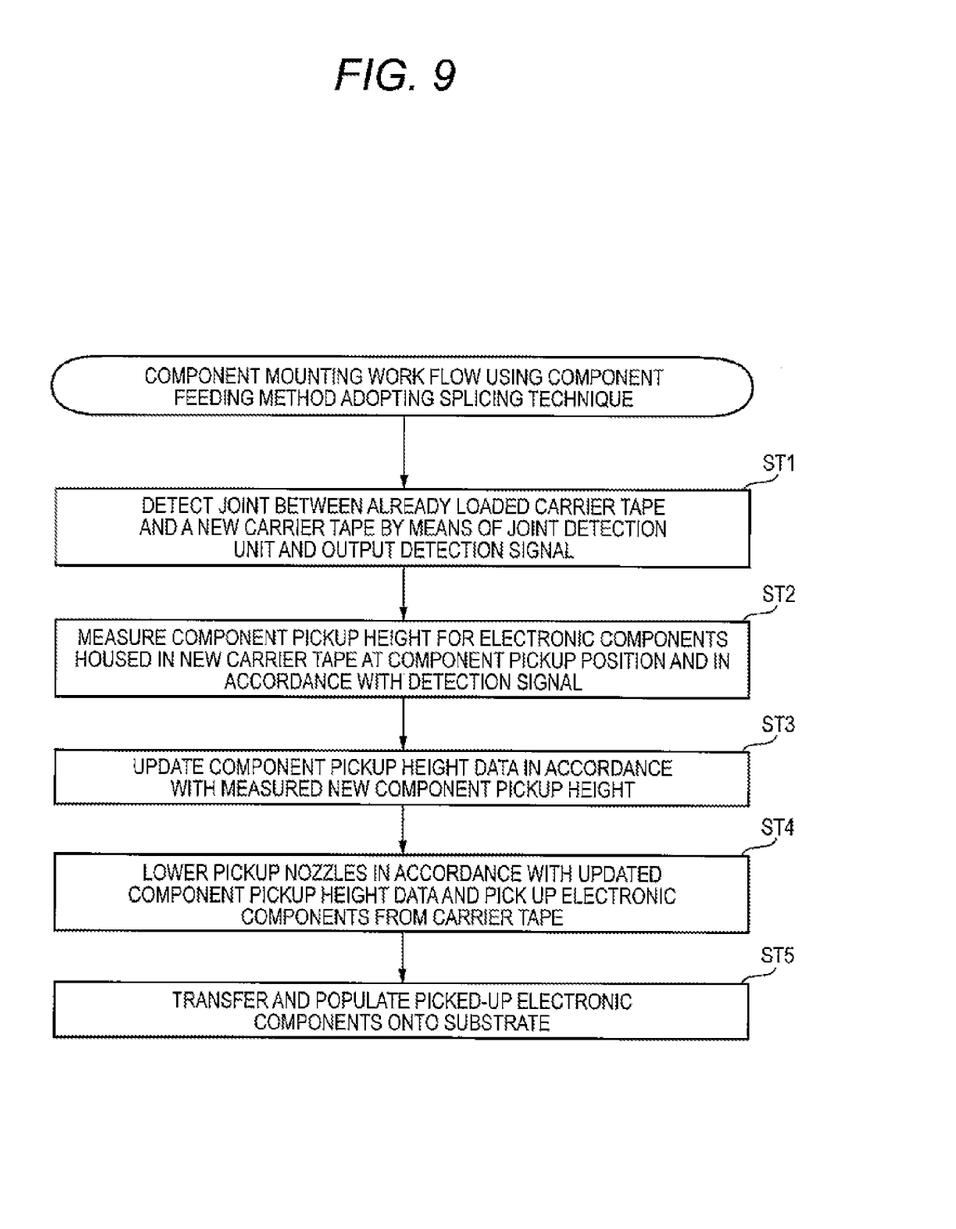
FIG. 9 is a work flow chart showing an electric component mounting method of the embodiment of the present invention.
Figure 10:
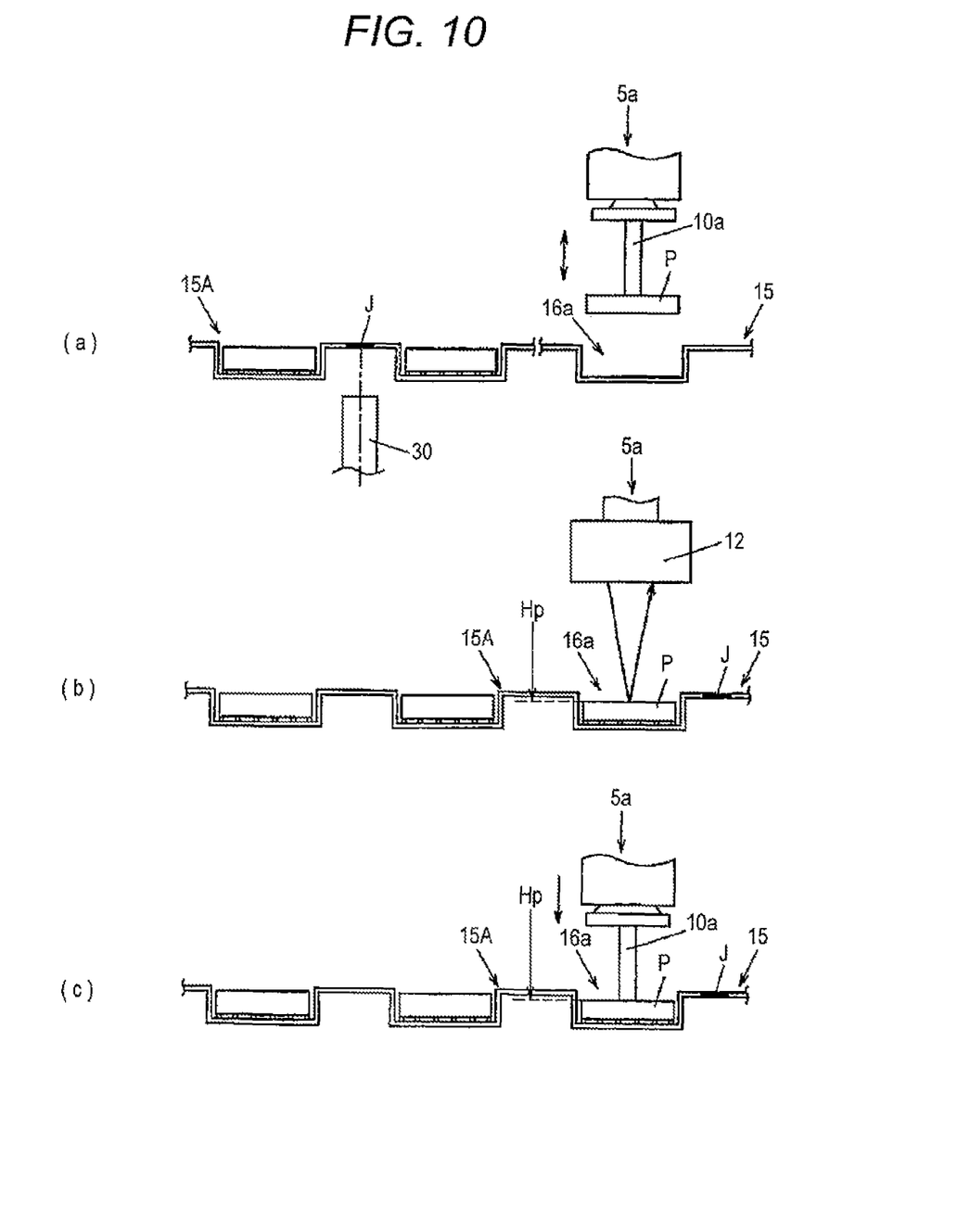
FIGS. 10(a) to (c) are explanatory flow charts showing the electronic component mounting method of the embodiment of the present invention.

Component mounting operation using the component feeding method adopting the splicing technique is now described by reference to FIG. 9 and FIGS. 10(*a*) to (*c*). When there is repeatedly performed component mounting operation for picking up the components P from the tape feeder 5 of the component feed unit 4 by means of the mount heads 9 and mounting the components to the component feed unit 4, the components P are fed while the already-loaded carrier tape 15 is spliced to the carrier tape 15A to be newly loaded. Every time the joint J approaches the component pickup position 5*a* in the course of this process, the joint detection unit 34 detects, as shown in FIG. 10(a), the joint J between the carrier tape 15 and the carrier tape 15A on the basis of the detection result produced by the optical sensor 30, thereupon outputting a detection signal (a joint detection step) (ST1).

According to the detection signal, the height measurement device 12 moved to the component pickup position 5a measures a height of an upper surface of the components P housed in the carrier tape 15A at timing at which a front-end component pocket 16a of the carrier tape 15A has arrived at the component pickup position 5a, as shown in FIG. 10(b). The component pickup height detection unit 35 receives the measurement signal, thereby determining a new component pickup height Hp (a component pickup height measurement step) (ST2). The existing component pickup height data 32a stored in the storage unit 32 are updated by means of the newly-measured component pickup height Hp (a component pickup height update step) (ST3). As shown in FIG. 10(c), the pickup nozzles 10a are lowered to the component pickup height Hp according to the updated component pickup height data 32a, thereby picking up the components P from the carrier tape 15A (ST4). Next, the thus-taken components P are transferred and populated to the substrate 3 (a component mounting step) (ST5).

As mentioned above, the present embodiment is directed toward an electronic component mounting device and an electronic component mounting method that adopt a tape splicing technique for splicing the carrier tape loaded on the tape feeder to the newly loaded carrier tape. When the joint J between the already-loaded carrier tape 15 and the newly-loaded carrier tape 15A is detected, the component pickup height detection unit 35 performs component pickup height measurement in connection with the tape feeder 5 for which the joint J has been detected, thereby updating the component pickup height data 32a representing a target lowering height to which the pickup nozzles 10a are to be lowered. Faulty component pickup operation attributable to a dimensional error, which would otherwise be caused by a difference in manufactures or production lots of the components P and the carrier tape 15, is prevented, thereby making it possible to render pickup operation stable.

The present patent application is based on Japanese Patent Application (JP-2010-240469) filed on Oct. 27, 2010, the entire subject matter of which is incorporated herein by reference.

INDUSTRIAL APPLICABILITY

The electronic component mounting apparatus and the electronic component mounting method of the present invention yield an advantage of the ability to assure stable pickup operation even when a dimensional error attributable to a difference in production lot exists in electronic components or carrier tapes and are useful in a field of transferring and populating electronic components picked up from tape feeders of a component feed unit to a substrate.

Descriptions of the Reference Numerals and Symbols
3 SUBSTRATE
4 COMPONENT FEED UNIT
5 TAPE FEEDER
6 COMPONENT RECOGNITION CAMERA
9 MOUNT HEAD
10 UNIT TRANSFER HEAD
10a PICKUP NOZZLE
10b NOZZLE ELEVATION MECHANISM
11 SUBSTRATE RECOGNITION CAMERA
12 HEIGHT MEASUREMENT DEVICE
14 FEED REEL
15, 15A CARRIER TAPE
16 BASE TAPE
16a COMPONENT POCKET
17 TOP TAPE
30 OPTICAL SENSOR
J JOINT
P COMPONENT

The invention claimed is:

1. An electronic component mounting method for pitch-feeding, by a tape feed mechanism, a carrier tape that is loaded on a tape feeder and that houses an electronic component and lowering a pickup nozzle at a component pickup position in accordance with component pickup height data stored in a storage unit, thereby picking up the electronic component by the pickup nozzle and transferring and populating the component onto a substrate, the method comprising:

an electronic components supplying step of supplying electronic components housed in an already-loaded carrier tape and a newly loaded carrier tape spliced to the already-loaded carrier tape at a joint;

a joint detection step of detecting the joint at which the newly loaded carrier tape is spliced to the already-loaded carrier tape and outputting a detection signal of the joint;

a component pickup height measurement step of measuring, at the component pickup position, a component pickup height for electronic components housed in the newly loaded carrier tape by a component pickup height detection unit in accordance with the detection signal output in the joint detection step, thereby determining a new component pickup height;

a component pickup height update step of updating the component pickup height data stored in the storage unit by means of the new component pickup height; and a component mounting step of lowering the pickup nozzle in accordance with the updated component pickup height data and picking up the electronic component from the newly loaded carrier tape and transferring and populating the electronic component onto a substrate.

2. The electronic component mounting method according to claim 1, wherein the joint detection step detects that the joint reaches a predetermined position upstream from the component pickup position.

* * * * *